United States Patent
Fujikawa

(10) Patent No.: US 11,761,114 B2
(45) Date of Patent: Sep. 19, 2023

(54) METHOD OF PRODUCING SIC SINGLE CRYSTAL INGOT

(71) Applicant: SHOWA DENKO K.K., Tokyo (JP)

(72) Inventor: Yohei Fujikawa, Hikone (JP)

(73) Assignee: Resonac Corporation, Tokyo (JP)

( * ) Notice: Subject to any disclaimer, the term of this patent is extended or adjusted under 35 U.S.C. 154(b) by 51 days.

(21) Appl. No.: 16/693,682

(22) Filed: Nov. 25, 2019

(65) Prior Publication Data

US 2020/0165743 A1 May 28, 2020

(30) Foreign Application Priority Data

Nov. 26, 2018 (JP) ................. 2018-220719

(51) Int. Cl.
*C30B 23/06* (2006.01)
*C30B 35/00* (2006.01)
*C30B 29/36* (2006.01)

(52) U.S. Cl.
CPC ............ *C30B 23/066* (2013.01); *C30B 29/36* (2013.01); *C30B 35/002* (2013.01)

(58) Field of Classification Search
CPC .............................. C30B 29/36; C30B 35/002
See application file for complete search history.

(56) References Cited

U.S. PATENT DOCUMENTS

2014/0202389 A1* 7/2014 Heo .................. C30B 29/36
118/726

FOREIGN PATENT DOCUMENTS

| CN | 102021653 A | 4/2011 |
|---|---|---|
| CN | 102534763 A | 7/2012 |
| CN | 103696012 A | 4/2014 |
| CN | 104246023 A | 12/2014 |
| CN | 204417651 U | 6/2015 |
| CN | 205711045 U | 11/2016 |
| EP | 1 026 290 A1 | 8/2000 |
| JP | 5-58774 A | 3/1993 |
| JP | 2000007492 A * | 1/2000 |
| JP | 2006-143497 A | 6/2006 |
| JP | 2007-76928 A | 3/2007 |
| JP | 2009051702 A * | 3/2009 |
| JP | 2010-76990 A | 4/2010 |
| JP | 2011-105570 A | 6/2011 |

(Continued)

OTHER PUBLICATIONS

Communication dated Apr. 2, 2021, issued by the State Intellectual Property Office of the P.R.C. in application No. 201911139201.9.

(Continued)

*Primary Examiner* — Hua Qi
(74) *Attorney, Agent, or Firm* — Sughrue Mion, PLLC

(57) ABSTRACT

In a method of producing a SiC single crystal ingot of the present invention, in a lower part of a crucible, a high thermal conductivity raw material layer containing a high thermal conductivity raw material and a low thermal conductivity raw material layer containing a low thermal conductivity raw material in at least one of a position above or below the high thermal conductivity raw material layer are disposed to form a raw material part, and heating is performed so that the raw material part reaches the maximum temperature in the high thermal conductivity raw material layer and a SiC single crystal ingot is grown.

7 Claims, 7 Drawing Sheets

(56) References Cited

FOREIGN PATENT DOCUMENTS

| JP | 2013103848 | A | * | 5/2013 |
| JP | 2017095304 | A | * | 6/2017 |
| KR | 10-2011-0012173 | A | | 2/2011 |
| KR | 10-2013-0070479 | A | | 6/2013 |

OTHER PUBLICATIONS

Q.S. Chen et al, "Heat transfer and kinetics of bulk growth of silicon carbide", Journal of Crystal Growth 230 (2001) 239-246.

* cited by examiner

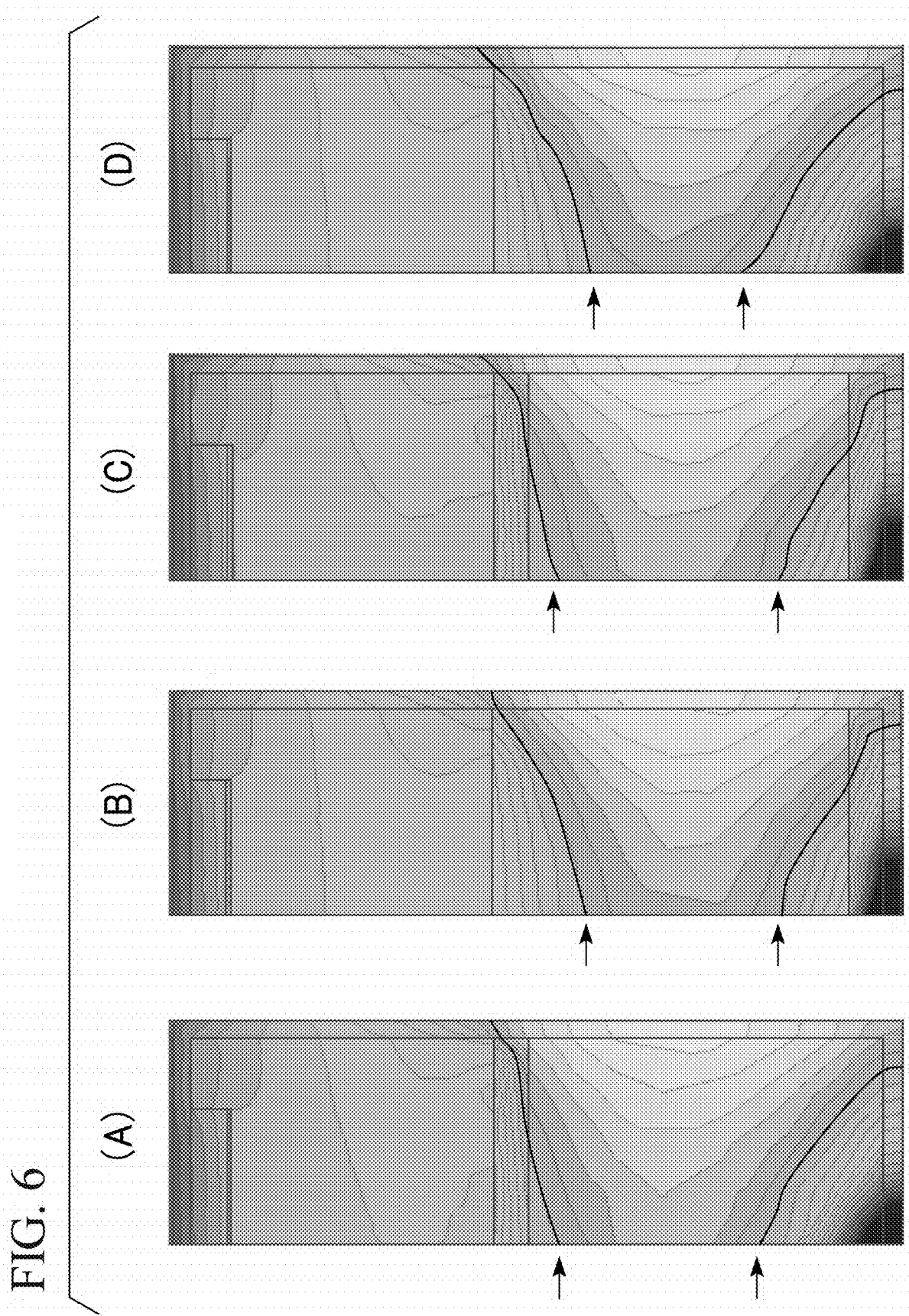

METHOD OF PRODUCING SIC SINGLE CRYSTAL INGOT

BACKGROUND OF THE INVENTION

Field of the Invention

The present invention relates to a method of producing a SiC single crystal ingot.

Priority is claimed based on Japanese Patent Application No. 2018-220719, filed Nov. 26, 2018, the content of which is incorporated herein by reference.

Description of Related Art

Silicon carbide (SiC) has a dielectric breakdown electric field that is one order of magnitude larger than that of silicon (Si) and a band gap that is three times that of silicon (Si). In addition, SiC has a characteristic of having a thermal conductivity about 3 times that of Si and the like. Therefore, SiC is expected to be applied to power devices, high frequency devices, high-temperature operating devices, and the like.

A SiC device is produced using a SiC epitaxial wafer in which an epitaxial layer (film) serving as an active area of a device is formed on a SiC single crystal substrate obtained by processing a SiC bulk single crystal grown by a sublimation method or the like by a chemical vapor deposition (CVD) method or the like.

Here, in this specification, the SiC wafer refers to a SiC single crystal ingot that is sliced into a wafer, the SiC epitaxial wafer refers to a SiC wafer on which an epitaxial film is formed, and the SiC device refers to an element formed on a SiC epitaxial wafer.

In recent years, with market demand, SiC wafers with a large diameter have been required. Thus, there is increasing demand for larger diameter and longer SiC ingots themselves.

A sublimation method is widely known as one method of producing a SiC single crystal ingot. The sublimation method is a method in which a seed crystal including a SiC single crystal is disposed in a graphite crucible, the crucible is heated so that a sublimation gas sublimated from a raw material powder (raw material) in the crucible is supplied to the seed crystal, and the seed crystal grows into a larger SiC single crystal ingot.

Since the raw material SiC accommodated in the crucible is heated from the side of the crucible wall, the side of the crucible wall is likely to be heated, and the central part of the crucible is likely to have a low temperature distribution. The temperature distribution in the crucible is particularly noticeable in a large crucible that is used to grow a SiC ingot having a larger diameter and length than those in the related art. Due to this temperature distribution in the crucible, there is a problem of a sublimation gas generated from the vicinity of the side of the crucible wall heated to a high temperature being crystallized at the central part at a low temperature and it is difficult to effectively use the raw material. That is, it is difficult to achieve both growth of a high-quality SiC ingot and growth of a SiC ingot with a high throughput at the same time. In particular, in growth of a larger-diameter and longer SiC ingot which requires a large amount of the raw material, crystallization at the central part of the crucible inhibits sublimation of the raw material after the middle stage of the growth and greatly reduces the growth rate. In addition, the raw material precipitated at the center of the crucible has a state different from the original powder and cannot be re-used directly. That is, in growth of a larger-diameter and longer SiC ingot, in order to reduce costs, it is desired to inhibit crystallization at the central part of the crucible and effectively use the raw material.

Patent Document 1 discloses a production method and production device for a single crystal ingot having a configuration in which a thermal conductor is disposed without disposing a raw material at the central part of the crucible that is more likely to be cooled than the side of the crucible wall.

PATENT DOCUMENTS

[Patent Document 1] Japanese Unexamined Patent Application, First Publication No. H5-58774

SUMMARY OF THE INVENTION

However, in the method of producing a SiC single crystal ingot described in Patent Document 1, the raw material is disposed only in the vicinity of the side of the crucible wall, and it is not possible to increase a growth amount of the SiC single crystal ingot that can be produced at one time. That is, the method of producing a SiC single crystal ingot described in Patent Document 1 has low throughput.

An object of the present invention is to provide a method of producing a SiC single crystal ingot in which it is possible to improve temperature uniformity of a raw material disposed in a crucible during production of a SiC single crystal ingot and it is possible to effectively use the raw material.

The inventors conducted extensive studies and as a result, found that, in a crucible, if a raw material layer with high thermal conductivity and a raw material layer with low thermal conductivity above or below the raw material layer with high thermal conductivity are disposed to form a raw material part, and heating is performed so that the raw material layer with high thermal conductivity reaches the maximum temperature, temperature distribution uniformity of the raw material part is thus improved. The present invention provides the following aspects in order to address the above problems.

(1) A method of producing a SiC single crystal ingot according to an aspect of the present invention includes, in a lower part of a crucible, forming a raw material part by disposing a high thermal conductivity raw material layer containing a high thermal conductivity raw material and a low thermal conductivity raw material layer containing a low thermal conductivity raw material in at least one of a position above or below the high thermal conductivity raw material layer; and performing heating so that the raw material part reaches the maximum temperature in the high thermal conductivity raw material layer and growing a SiC single crystal ingot.

(2) In the method of producing a SiC single crystal ingot according to the aspect of the present invention, the low thermal conductivity raw material layer may be disposed above and below the high thermal conductivity raw material layer to form a raw material part.

(3) In the method of producing a SiC single crystal ingot according to (1) or (2), high thermal conductivity raw material particles constituting the high thermal conductivity raw material layer may have a larger particle size than low thermal conductivity raw material particles constituting the low thermal conductivity raw material layer.

(4) In the method of producing a SiC single crystal ingot according to any one of (1) to (3), the high thermal conductivity raw material layer may have a lower porosity than the low thermal conductivity raw material layer.

(5) In the method of producing a SiC single crystal ingot according to any one of (1) to (4), an insulating material may be disposed on the bottom in the crucible.

(6) In the method of producing a SiC single crystal ingot according to any one of (1) to (5), an insulating material may be disposed outside the bottom of the bottom of the crucible.

In the method of producing a SiC single crystal ingot according to the above aspects, it is possible to provide a method of producing a SiC single crystal ingot in which it is possible to improve temperature uniformity of a raw material disposed in a crucible during production of a SiC single crystal ingot and it is possible to effectively use the raw material.

BRIEF DESCRIPTION OF THE DRAWINGS

FIG. 6 shows diagrams of a temperature distribution in a crucible when a SiC single crystal ingot is produced according to the method of producing a SiC single crystal ingot according to the aspect of the present invention.

DETAILED DESCRIPTION OF THE INVENTION

Figure 1:
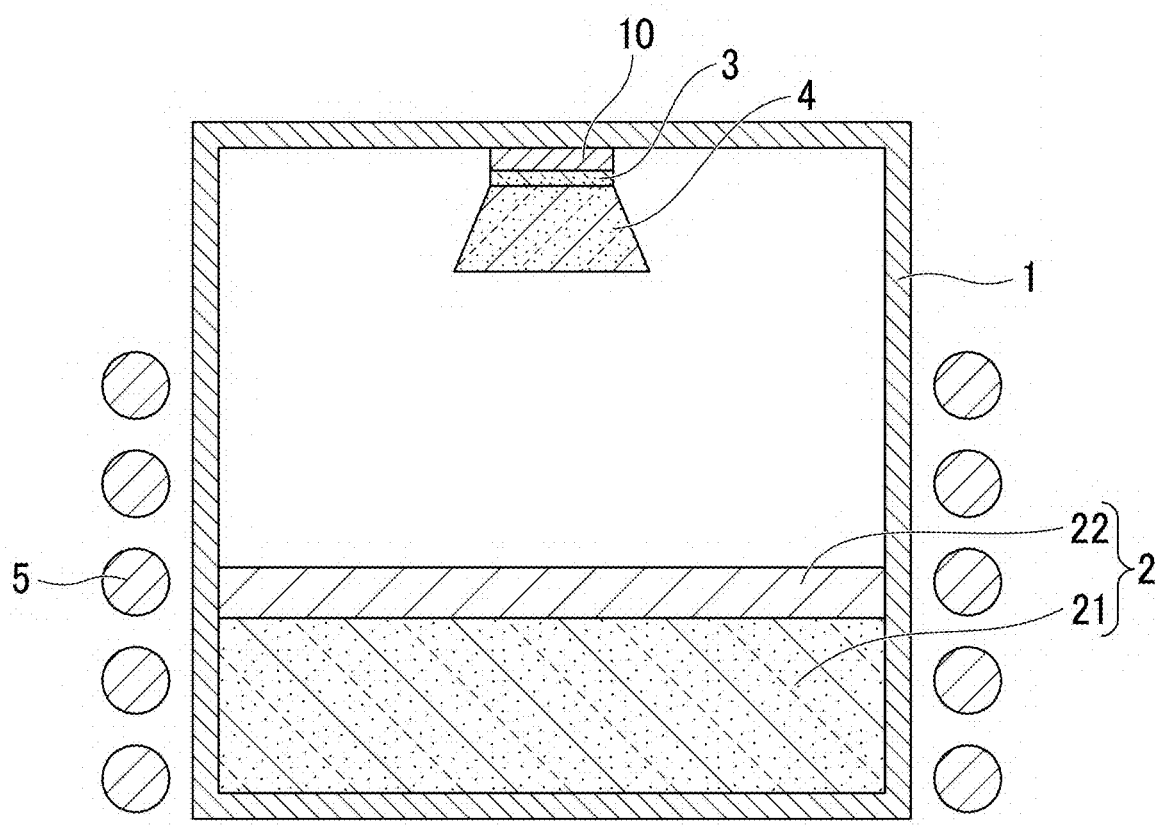
FIG. 1 is a cross-sectional schematic view showing a state in which a SiC single crystal ingot is produced using a method of producing a SiC single crystal ingot according to an aspect of the present invention.

Hereinafter, embodiments of the present invention will be appropriately described in detail with reference to the drawings. In the drawings used in the following description, in order to facilitate understanding of features of the present invention, feature parts are enlarged for convenience of illustration in some cases, and size ratios and the like of components may be different from actual components. Materials, sizes, and the like exemplified in the following description are examples, the present invention is not limited thereto, and they can be appropriately changed and implemented without departing from the spirit and scope of the invention.

"Method of Producing a SiC Single Crystal Ingot"

The method of producing a SiC single crystal ingot according to the present embodiment is a method of producing a SiC single crystal ingot using a sublimation method in which, in a lower part of a crucible, a high thermal conductivity raw material layer containing a high thermal conductivity raw material and a low thermal conductivity raw material layer containing a low thermal conductivity raw material in at least one of a position above or below the high thermal conductivity raw material layer are disposed to form a raw material part, heating is performed so that the raw material part reaches the maximum temperature in the high thermal conductivity raw material layer and a SiC single crystal ingot is grown.

FIG. 1 is a cross-sectional schematic view showing an example of a state in which a SiC single crystal ingot is produced using a method of producing a SiC single crystal ingot according to the present embodiment.

The sublimation method is a method in which a seed crystal 3 containing a SiC single crystal ingot raw material is disposed on a pedestal 10 in a crucible 1 including the pedestal 10 at the ceiling, a raw material part 2 is placed on the inner surface of the crucible 1, the crucible 1 is heated, and thus gases (Si, $Si_2C$, $SiC_2$, etc.) sublimated from the raw material part 2 containing the raw material are supplied to the seed crystal 3, and the seed crystal 3 grows into a larger SiC single crystal ingot.

Regarding the material of the crucible 1, for example, graphite, or a material in which graphite is covered with tantalum, can be used. Since the crucible 1 is heated during growth of a SiC single crystal ingot 4, it is necessarily formed of a material that can withstand high temperatures. For example, graphite has a high sublimation temperature of 3,550° C. and can withstand high temperatures during growth.

The crucible 1 is heated using a heating unit disposed so that it covers the outer periphery of the crucible 1. The heating unit is not limited, and for example, a high frequency induction heating coil 5 can be used for heating. An AC voltage is applied to the high frequency induction heating coil 5, an induced current is generated in the crucible 1, and heat is generated. Therefore, when a current is applied to the high frequency induction heating coil 5, the crucible 1 and the raw material part 2 in which the raw material is filled inside the crucible 1 can be heated. In this specification, a case in which the high frequency induction heating coil 5 is used as a heating unit is an exemplary example.

If the configuration of the high frequency induction heating coil 5 is adjusted, when the crucible 1 is heated, it can be heated so that a point of the maximum temperature inside the crucible 1 is within a high thermal conductivity raw material layer 21.

For example, the above heating can be performed by adjusting the height of the high frequency induction heating coil 5 according to the height of the high thermal conductivity raw material layer 21. In consideration of a temperature distribution, preferably, the height of the high frequency induction heating coil 5 is adjusted so that a point of the maximum temperature inside the crucible 1 is the center position of the high thermal conductivity raw material layer 21 in the vertical direction.

In the case of the raw material part 2 shown in FIG. 1, a proportion of the high thermal conductivity raw material layer 21 in the raw material is the largest. Therefore, the growth rate of the SiC single crystal ingot 4 greatly depends on the sublimation rate of the raw material of the high thermal conductivity raw material layer 21. Accordingly, the growth rate of the SiC single crystal ingot 4 can be increased by performing heating so that a point of the maximum temperature inside the crucible 1 is within the high thermal conductivity raw material layer 21.

In addition, as shown below, a low thermal conductivity raw material layer 22 (and 23) serves as an insulating material that prevents heat from being transferred from the high thermal conductivity raw material layer 21 to the upper part or the lower part on the lower low temperature side, and improves the temperature distribution uniformity of the high thermal conductivity raw material layer 21. When the temperature distribution of the high thermal conductivity raw material layer 21 is uniform, it is possible to effectively use the raw material. When the low thermal conductivity raw material layer 22 (and 23) reaches a point of the maximum temperature inside the crucible 1, since the above insulation effect cannot be sufficiently obtained, the crucible 1 is heated so that a point of the maximum temperature inside the crucible 1 is within the high thermal conductivity raw material layer 21.

The periphery of the crucible 1 is covered with a chamber (not shown). The chamber includes a gas inlet and a gas outlet. Argon gas, a dopant gas, or the like is supplied into the chamber through the gas inlet. Such a gas is discharged from the inside of the chamber through the gas outlet. Regarding the material of the chamber, for example, quartz, stainless steel, or the like can be used, but the material is not limited thereto as long as it can maintain a high degree of vacuum.

Figure 2:
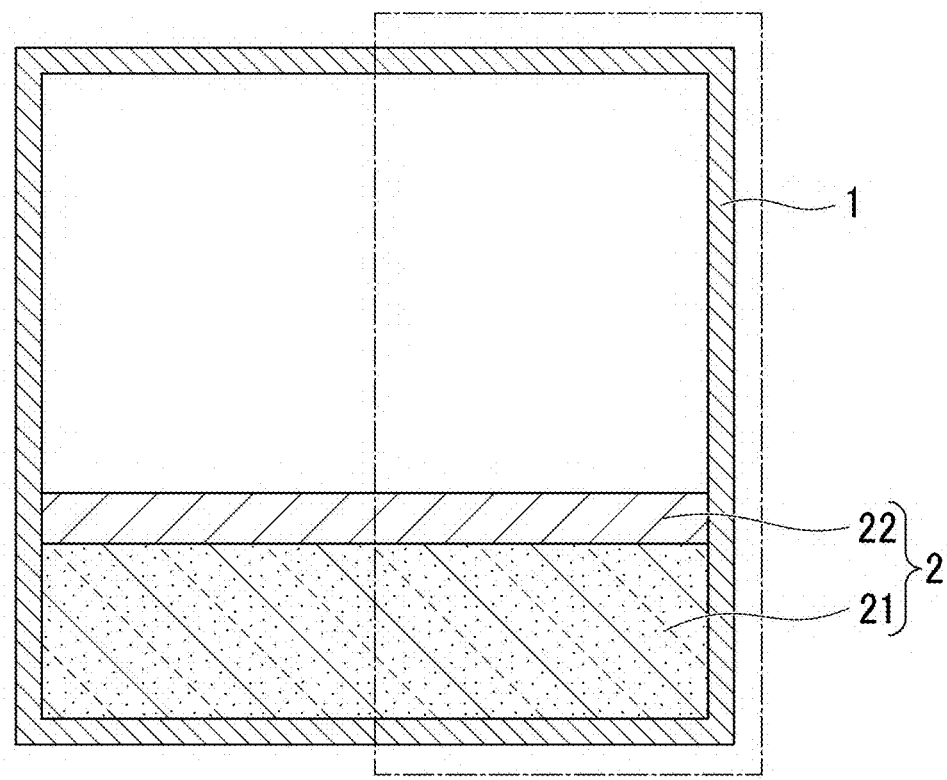
FIG. 2 is a cross-sectional schematic view showing an example of a method of disposing a SiC raw material in the method of producing a SiC single crystal ingot according to the aspect of the present invention.

FIG. 2 is a cross-sectional schematic view schematically showing a state in which the raw material of the raw material part 2 is accommodated in the crucible 1 in the method of producing a SiC single crystal ingot according to the present embodiment.

The raw material part 2 is a laminate including two separate layers. The low thermal conductivity raw material layer 22 and the high thermal conductivity raw material layer 21 are formed in that order from the side close to the seed crystal 3, and both are formed of a raw material of the SiC single crystal ingot 4. The low thermal conductivity raw material layer 22 is formed of a raw material having lower thermal conductivity than a raw material forming the high thermal conductivity raw material layer 21. Here, in the drawing, the high thermal conductivity raw material layer 21 and the low thermal conductivity raw material layer 22 are separated into layers, but this is only a schematic view, and actually, they are in an accommodation state (lamination state) in which the high thermal conductivity raw material layer 21 is accommodated, and then the low thermal conductivity raw material layer 22 is accommodated.

When the raw material part 2 is accommodated as shown in FIG. 2, it is possible to improve temperature distribution uniformity of the high thermal conductivity raw material layer 21. In addition, when temperature distribution uniformity of the high thermal conductivity raw material layer 21 is improved, it is possible to effectively use the raw material.

Figure 3:
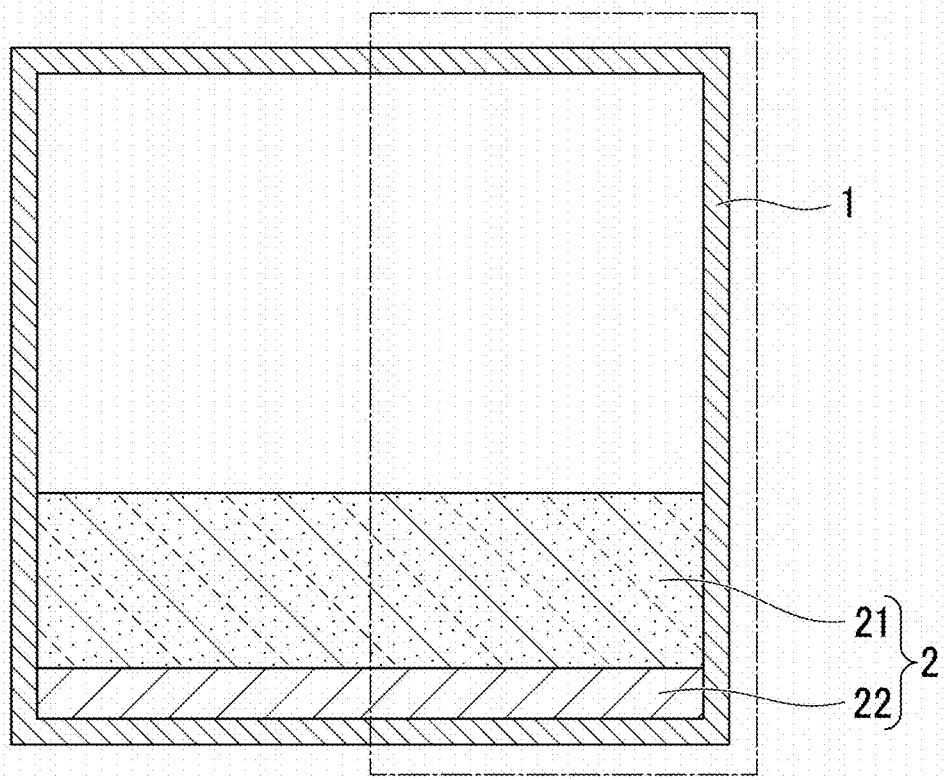
FIG. 3 is a cross-sectional schematic view showing an example of a method of disposing a SiC raw material in the method of producing a SiC single crystal ingot according to the aspect of the present invention.
Figure 4:
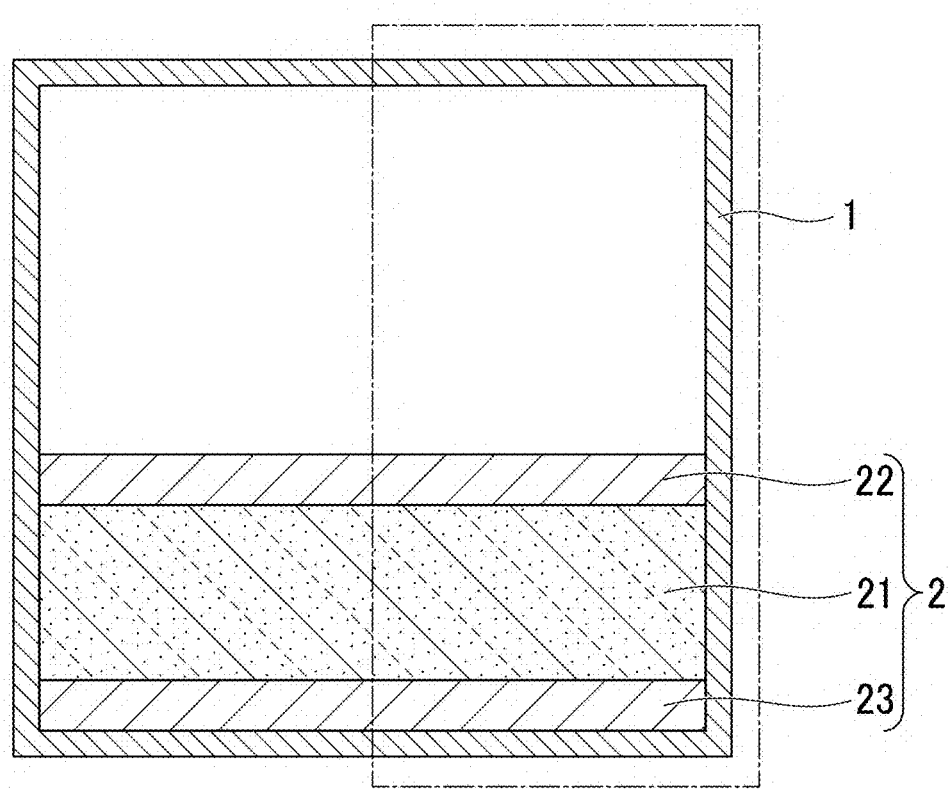
FIG. 4 is a cross-sectional schematic view showing an example of a method of disposing a SiC raw material in the method of producing a SiC single crystal ingot according to the aspect of the present invention.

FIG. 3 and FIG. 4 are cross-sectional schematic views schematically showing a state in which the raw material part 2 is accommodated in the crucible 1 in the method of producing a SiC single crystal ingot according to another embodiment of the present invention.

As shown in FIG. 3, the high thermal conductivity raw material layer 21 and the low thermal conductivity raw material layer 22 may be disposed in that order from the side close to the seed crystal 3. In this configuration also, it is possible to improve temperature distribution uniformity of the high thermal conductivity raw material layer 21, and it is possible to effectively use the raw material.

Preferably, as shown in FIG. 4, the low thermal conductivity raw material layer 22 is disposed above the high thermal conductivity raw material layer 21 and additionally the low thermal conductivity raw material layer 23 is laminated below the high thermal conductivity raw material layer 21. When the low thermal conductivity raw material layers 22 and 23 are disposed above and below the high thermal conductivity raw material layer 21, it is possible to improve temperature distribution uniformity of the high thermal conductivity raw material layer 21 more than when the low thermal conductivity raw material layer is laminated above or below the high thermal conductivity raw material layer 21. Therefore, it is possible to more effectively use the raw material.

The high thermal conductivity raw material layer 21 can be formed by disposing a raw material so that it has higher thermal conductivity than the low thermal conductivity raw material layers 22 and 23. Examples of disposing a raw material so that thermal conductivity is higher than those of the low thermal conductivity raw material layers 22 and 23 include disposing a raw material having a larger particle size than those of the low thermal conductivity raw material layers 22 and 23 and disposing a raw material so that the porosity is lower than those of the low thermal conductivity raw material layers 22 and 23.

Examples of a raw material having a larger particle size include a SiC raw material having a particle size of about 300 to 800 am.

The effective thermal conductivity $k_{eff}$ of the filled SiC powder raw material can be theoretically determined according to the following [Math. 1] formula (Q. S. Chen et al./Journal OF Crystal Growth 230 (2001) 239-246).

$$k_{eff} = (1-\varepsilon_p)k_{SiC} + \varepsilon_p\left(\varepsilon_{gas} + \frac{8}{3}\varepsilon\sigma 4T^3 d_p\right) \quad \text{[Math. 1]}$$

($\varepsilon_p$: porosity, $\varepsilon$: emissivity, $d_p$: average particle size, $k_{sic}$: thermal conductivity of SiC, $k_{gas}$: thermal conductivity of gas, T: temperature, σ: Stefan Boltzmann constant)

A method of changing the average particle size of SiC raw material powder particles is one of methods of changing thermal conductivity. When SiC raw material powder particles having a large particle size are used, thermal conductivity can be increased.

In addition, as shown in [Math. 1], changing the porosity is one of methods of changing thermal conductivity. Therefore, in the present embodiment, thermal conductivity of the SiC raw material may be changed by changing the porosity.

In a temperature range of 2,000° C. to 2,500° C. used for SiC single crystal growth, thermal conductivity of the raw material decreases as the porosity increases.

In the high thermal conductivity raw material layer, the SiC raw material heated for a short time may be disposed. When the raw material is heated for a short time, some of raw material particles adhere to each other, and the pseudo average particle size increases. That is, when the SiC raw material is heated for a short time, thermal conductivity is improved.

The high thermal conductivity raw material layer 21 may be disposed so that it has higher thermal conductivity than the low thermal conductivity raw material layers 22 and 23, and a method of disposing the raw material is not limited.

It is preferable that the high thermal conductivity raw material layer 21 have higher thermal conductivity than the low thermal conductivity raw material layers 22 and 23.

The thickness of the high thermal conductivity raw material layer 21 can be appropriately selected, and a thicker high thermal conductive layer is preferable. For example, the thickness of the high thermal conductivity raw material layer 21 is preferably 2 to 10 times that of the low thermal conductive layer.

In the low thermal conductivity raw material layers 22 and 23, a raw material can be disposed so that thermal conductivity is lower than that of the high thermal conductivity raw material layer 21. Examples of disposing a raw material so that thermal conductivity is lower than that of the high thermal conductivity raw material layer 21 include disposing a raw material having a smaller particle size than that of the high thermal conductivity raw material layer 21 and disposing a raw material so that the porosity is higher than that of the high thermal conductivity raw material layer 21. A raw material of a SiC single crystal ingot heated for a long time may be disposed. Although the predetermined time varies depending on the particle size, the temperature, and the like, when the SiC raw material is heated for a predetermined time or longer, thermal conductivity decreases. When SiC is heated, desorption and sublimation preferentially occur from Si with a high vapor pressure. Therefore, the raw material residue gradually becomes porous carbon due to heating and sublimation. This change in the state means that, in [Math. 1], the porosity $\varepsilon_p$ increases and the particle size $d_p$ decreases, and thermal conductivity of the raw material decreases. That is, the raw material residue in the form of porous carbon may be used as the low thermal conductivity raw material layer 22 or 23.

A larger difference in thermal conductivities between the low thermal conductivity raw material layers 22 and 23 and the high thermal conductivity raw material layer 21 is preferable.

The thinner low thermal conductivity raw material layers 22 and 23 are preferable as long as the insulation effect can be maintained.

When the low thermal conductivity raw material layer 22 is formed above the high thermal conductivity raw material layer 21, a porous material is preferably used. In this configuration, a gas sublimated from the raw material part 2 can be easily transmitted.

The high thermal conductivity raw material layer 21 and the low thermal conductivity raw material layers 22 and 23 can be appropriately selected according to accommodation conditions so that temperature distribution uniformity of the high thermal conductivity raw material layer 21 is improved.

Figure 5A:
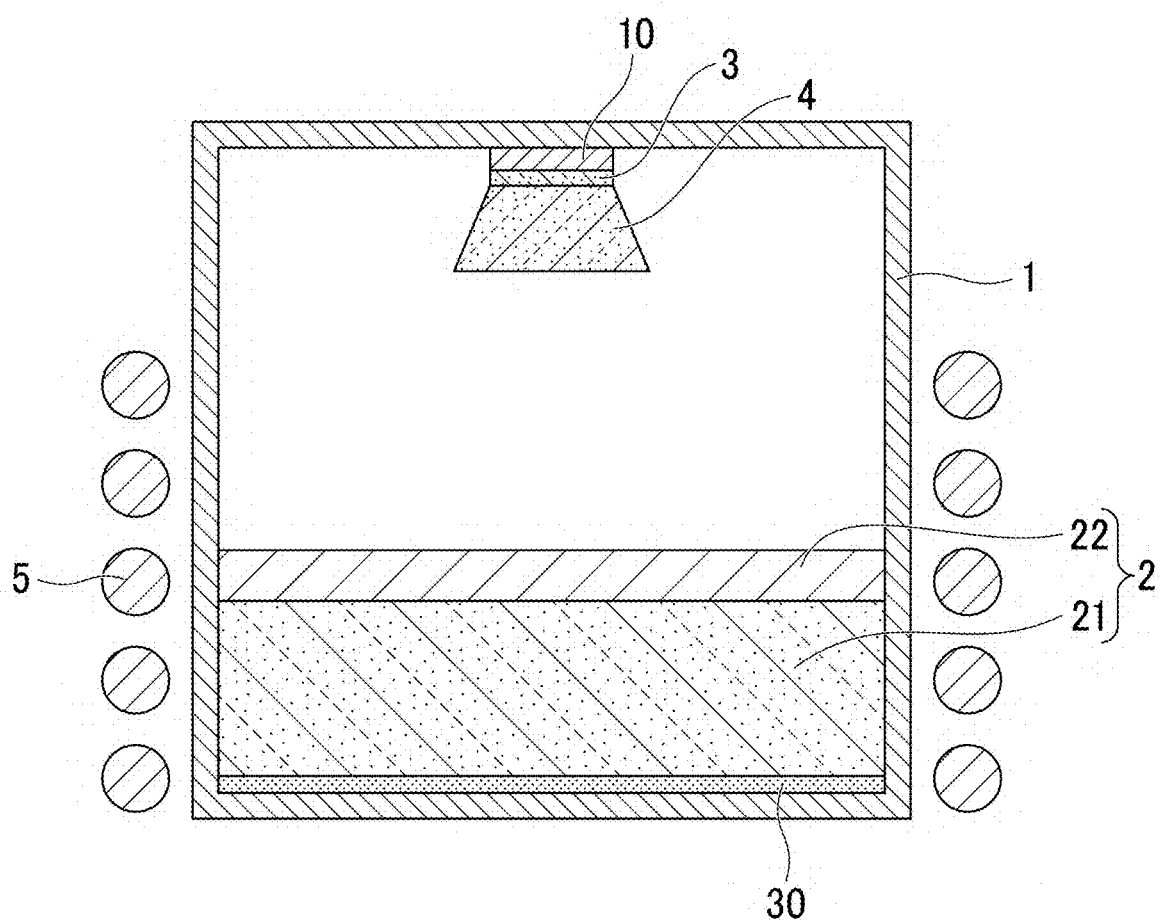
FIG. 5A is a cross-sectional schematic view showing an example of a state in which a SiC single crystal ingot is produced in the method of producing a SiC single crystal ingot according to the aspect of the present invention.
Figure 5B:
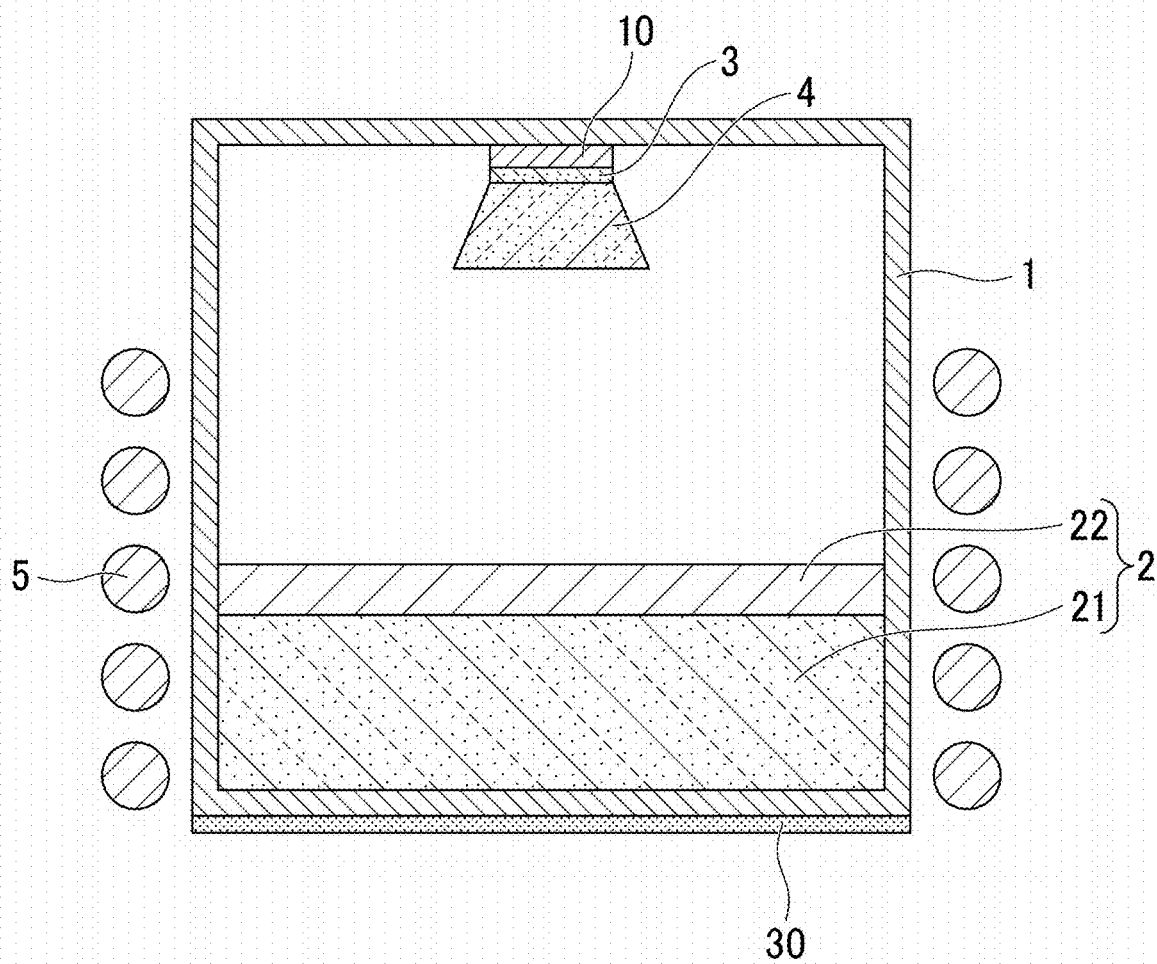
FIG. 5B is a cross-sectional schematic view showing an example of a state in which a SiC single crystal ingot is produced in the method of producing a SiC single crystal ingot according to the aspect of the present invention.

FIGS. 5A and 5B are a cross-sectional schematic view showing an example of a state in which a SiC single crystal ingot is grown in the method of producing a SiC single crystal ingot according to the present embodiment. As shown in FIGS. 5A and 5B, it is preferable to dispose an insulating material 30 between the raw material part 2 and the crucible 1. When the insulating material 30 is disposed, an amount of heat of the raw material part 2 released to the outside is reduced. Therefore, it is possible to reduce an amount of heat provided from the outside and improve temperature distribution uniformity of the raw material part 2.

In addition, the insulating material 30 may be disposed inside the crucible 1 as shown in FIG. 5A and may be disposed outside the crucible 1 as shown in FIG. 5B. Preferably, when a porous material is used, it is disposed outside since thermal conductivity may change due to precipitation of SiC in voids.

A known material can be used as the insulating material 30. Preferably, an insulating material having lower thermal conductivity than the low thermal conductivity raw material layer and an insulating material 30 formed of Si or C are used. When the insulating material 30 formed of Si or C is used, it is possible to prevent impurities from being mixed into the SiC single crystal ingot 4 that is grown. Regarding the insulating material 30, for example, a felt, a flexible graphite material, a molded insulating material or the like can be used, but the material is not limited thereto. In addition, regarding the insulating material 30, known insulating materials may be used in combination. For example, in order from the side close to the raw material, a carbon plate, a felt, a flexible graphite material, and the like may be disposed in combination.

FIG. 6 shows results obtained by performing a simulation of temperature distribution in the crucible when the crucible 1 is heated by the high frequency induction heating coil 5 surrounding the periphery of the crucible 1 in a production device used in the method of producing a SiC single crystal ingot according to the aspect of the present invention. A lighter color area has a higher temperature and a darker color area has a lower temperature.

This simulation is performed using vapor crystal growth analysis software "Virtual Reactor" (commercially available from STR-Group Ltd).

Regarding the accommodation state of the raw material part 2 in the crucible 1 in the model used for the simulation, (A) is an accommodation state shown in FIG. 2, (B) is an accommodation state shown in FIG. 3, (C) is an accommodation state shown in FIG. 4, and (D) shows a state in which a raw material part 2 is accommodated in a single layer as a comparative example. Here, areas shown in FIGS. 6(A) to 6(C) are areas indicated by dashed lines in FIG. 2 to FIG. 4. The area shown in FIG. 6(D) is an area corresponding to the area indicated by the dashed line in FIG. 2 when the inner bottom of the crucible 1 is filled with only the high thermal conductivity raw material layer 21.

Since the crucible 1 and the internal structure of the crucible 1 are configured symmetrically with respect to the central axis, the simulation results can be handled as a temperature distribution in the entire crucible 1.

In the simulation, the thermal conductivity of the raw material of the high thermal conductivity raw material layer 21 is set to 5 W/m·K, and the thermal conductivity of the low thermal conductivity raw material layers 22 and 23 is set to 2 W/m·K. A raw material having a thermal conductivity of 5 W/m·K is accommodated in the entire raw material part 2 of Comparative Example (D).

Arrows in FIG. 6 indicate points at the endmost part in which the temperature is 2,275° C. on the central axis of the area in which the raw material of the crucible 1 is disposed. Since the disposed raw material part 2 has a higher temperature in the area closer to the high frequency induction heating coil 5, temperature distribution uniformity in the crucible is higher when an interval between the arrows in FIG. 6 is wider. Therefore, based on the simulation results, it is found that the temperature distribution uniformity is higher in the accommodation state of the raw material shown in FIG. 2 to FIG. 4 than a state in which the raw material part 2 is accommodated in a single layer. Here, in order to increase temperature distribution uniformity, the accommodation state shown in FIG. 2 and FIG. 4 is preferable, and the accommodation state shown in FIG. 4 is more preferable.

As described above, in the method of producing a SiC single crystal ingot according to the present embodiment, a high-quality SiC single crystal ingot can be grown with higher throughput than those in the related art. That is, it is possible to effectively use the raw material.

EXPLANATION OF REFERENCES

1 Crucible
2 Raw material part

3 Seed crystal
4 Single crystal ingot (SiC single crystal ingot)
5 High frequency induction heating coil
10 Pedestal
21 High thermal conductivity raw material layer
22 Low thermal conductivity raw material layer
23 Low thermal conductivity raw material layer
30 Insulating material

What is claimed is:

1. A method of producing a SiC single crystal ingot, comprising:
   in a lower part of a crucible, forming a raw material part by disposing a high thermal conductivity raw material layer containing a high thermal conductivity raw material formed of SiC and a low thermal conductivity raw material layer containing a low thermal conductivity raw material formed of SiC in a position above or below the high thermal conductivity raw material layer;
   adjusting a position of a heating unit in a vertical direction such that a point of maximum temperature is within the high thermal conductivity raw material layer; and
   heating an inside of the crucible to a temperature of 2,000° C. to 2,500° C., sublimating the raw material and growing the SiC single crystal ingot,
   wherein a thickness of the high thermal conductivity raw material layer is 2 to 10 times a thickness of the low thermal conductivity raw material layer.

2. The method of producing a SiC single crystal ingot according to claim 1,
   wherein high thermal conductivity raw material particles constituting the high thermal conductivity raw material layer have a larger particle size than low thermal conductivity raw material particles constituting the low thermal conductivity raw material layer.

3. The method of producing a SiC single crystal ingot according to claim 1,
   wherein the high thermal conductivity raw material layer has a lower porosity than the low thermal conductivity raw material layer.

4. The method of producing a SiC single crystal ingot according to claim 1,
   wherein an insulating material is disposed on the bottom in the crucible.

5. The method of producing a SiC single crystal ingot according to claim 1,
   wherein an insulating material is disposed outside the bottom of the crucible.

6. The method of producing a SiC single crystal ingot according to claim 1,
   wherein the high thermal conductivity raw material particles have a particle size of 300 µm or more and 800 µm or less.

7. The method of producing a SiC single crystal ingot according to claim 1,
   wherein the low thermal conductivity raw material layer is disposed above and below the high thermal conductivity raw material layer to form the raw material part.

* * * * *